US012765144B2

(12) United States Patent
Lei et al.

(10) Patent No.: US 12,765,144 B2
(45) Date of Patent: Oct. 13, 2026

(54) DRIVE BASE PLATE, LIGHT-EMITTING BASE PLATE, AND DISPLAY DEVICE

(71) Applicants: HEFEI BOE RUISHENG TECHNOLOGY CO., LTD., Hefei (CN); BOE Technology Group Co., Ltd., Beijing (CN)

(72) Inventors: Jie Lei, Beijing (CN); Jian Tian, Beijing (CN); Chunjian Liu, Beijing (CN); Jianying Zhang, Beijing (CN); Yajun Ma, Beijing (CN)

(73) Assignees: HEFEI BOE RUISHENG TECHNOLOGY CO., LTD., Hefei (CN); Beijing BOE Technology Development Co., Ltd., Beijing (CN)

( * ) Notice: Subject to any disclaimer, the term of this patent is extended or adjusted under 35 U.S.C. 154(b) by 472 days.

(21) Appl. No.: 18/272,456

(22) PCT Filed: Aug. 26, 2022

(86) PCT No.: PCT/CN2022/115110
§ 371 (c)(1),
(2) Date: Jul. 14, 2023

(87) PCT Pub. No.: WO2024/040567
PCT Pub. Date: Feb. 29, 2024

(65) Prior Publication Data
US 2024/0413284 A1 Dec. 12, 2024

(51) Int. Cl.
*H10H 20/857* (2025.01)
*H10H 20/853* (2025.01)
(Continued)

(52) U.S. Cl.
CPC ........ *H10H 20/857* (2025.01); *H10H 20/853* (2025.01); *H10H 20/854* (2025.01); *H10W 90/00* (2026.01)

(58) Field of Classification Search
CPC .. H10H 20/857; H10H 20/853; H10H 20/854; H01L 25/0753; H01L 23/498; G09F 9/33; G09F 9/35
See application file for complete search history.

(56) References Cited

U.S. PATENT DOCUMENTS

2018/0061910 A1 3/2018 Cai
2021/0359249 A1 11/2021 Zhang et al.
2022/0319396 A1 10/2022 Zhang et al.

FOREIGN PATENT DOCUMENTS

CN 113096549 A 7/2021
CN 114551550 A 5/2022
(Continued)

*Primary Examiner* — Fernando L Toledo
*Assistant Examiner* — Shawn Shaw Muslim
(74) *Attorney, Agent, or Firm* — WHDA, LLP

(57) ABSTRACT

The present disclosure provides a drive base plate, a light-emitting base plate, a display device, and a manufacturing method for the drive base plate. The drive base plate includes: a substrate; and a first conductive layer and a first block layer disposed on the substrate, the first conductive layer includes multiple first conductive portions arranged at intervals, and each of the first conductive portions includes a first contact pad; the first block layer includes first hollowed-out regions, each of the first hollowed-out regions corresponds to a respective first contact pads, an orthographic projection of the first contact pad on the substrate is within the orthographic projection of the first hollowed-out region on the substrate, and the material of the first block layer includes an oxidation-resistant material.

18 Claims, 4 Drawing Sheets

(51) Int. Cl.
*H10H 20/854* (2025.01)
*H10W 90/00* (2026.01)

(56) References Cited

FOREIGN PATENT DOCUMENTS

| | | | | | |
|---|---|---|---|---|---|
| CN | 114823608 | | * | 7/2022 | ........ H01L 23/49811 |
| CN | 114823608 | A | * | 7/2022 | ........ H01L 23/49811 |
| WO | WO-2023184505 | A1 | * | 10/2023 | ........... H10D 86/021 |

* cited by examiner

DRIVE BASE PLATE, LIGHT-EMITTING BASE PLATE, AND DISPLAY DEVICE

CROSS-REFERENCE TO RELATED APPLICATION

This application is a national phase application under 35 U.S.C. § 371 of International Patent Application No. PCT/CN2022/115110 filed on Aug. 26, 2022, entitled "DRIVE BASE PLATE, LIGHT-EMITTING BASE PLATE, AND DISPLAY DEVICE", the disclosure of which is incorporated by reference in its entirety herein.

TECHNICAL FIELD

The present disclosure relates to the field of display technology, and more particularly to a drive base plate, a light-emitting base plate, and a display device.

BACKGROUND

A micro light-emitting diode with a size of approximately less than 500 μm has a significantly increased usage trend in the display field due to the small size and advantages such as ultra-high brightness and a long service life.

Among the micro-display products, a major concern in the display field is how to improve the yield of Mini LED products.

SUMMARY

The present disclosure provides a drive base plate, including:

a substrate; and a first conductive layer and a first block layer disposed on the substrate, the first conductive layer includes multiple first conductive portions arranged at intervals, and each of the first conductive portions includes a first contact pad;

the first block layer comprises first hollowed-out regions, each of the first hollowed-out regions corresponds to a respective first contact pad, an orthographic projection of the first contact pad on the substrate is within an orthographic projection of the first hollowed-out region on the substrate, and a material of the first block layer includes an oxidation-resistant material.

In an optional embodiment, the first block layer is disposed on a side of the first conductive layer facing away from the substrate; a first insulation layer is disposed on a side of the first block layer facing away from the substrate, and the first insulation layer is provided with a first opening; the orthogonal projection of the first hollowed-out region on the substrate is located within the orthogonal projection of the first opening on the substrate, and a surface of the first contact pad facing away from the substrate is exposed.

In an optional embodiment, the first block layer covers at least a side surface of any of the first conductive portions, the side surface being multiple faces adjoining a bottom surface of any of the first conductive portions facing the substrate.

In an optional embodiment, the drive base plate further includes: a second conductive layer located on a side of the first conductive layer facing away from the substrate, the first block layer being located between the first conductive layer and the second conductive layer; the second conductive layer comprises multiple conductive portion groups, each conductive portion group among the multiple conductive portion groups includes at least two second conductive portions, and each of the second conductive portions comprises a second contact pad; the second contact pad passes through the first hollowed-out region to directly lap over the first contact pad, and a surface of the second contact pad facing away from the substrate is exposed.

In an optional embodiment, the drive base plat further includes: a second insulation layer located on a side of the first conductive layer facing away from the substrate; the first block layer is located on a side of the second insulation layer facing away from the substrate, and the second conductive layer is located on a side of the first block layer facing away from the substrate; the second insulation layer includes multiple second openings, and the second contact pad passes through the first hollowed-out region and the second opening to directly lap over the first contact pad; an orthographic projection of the second opening on the substrate is within the orthographic projection of the first hollowed-out region on the substrate.

In an optional embodiment, the drive base plate further includes: a second block layer located between the first conductive layer and the second insulation layer, a material of the second block layer comprises an oxidation-resistant material; the second block layer includes a second hollowed-out region, and the second contact pad passes through the first hollowed-out region, the second opening, and the second hollowed-out region in sequence, and directly laps over the first contact pad; wherein the orthographic projection of the second opening on the substrate is located within an orthographic projection of the second hollowed-out region on the substrate.

In an optional embodiment, the oxidation-resistant material includes a molybdenum-niobium alloy.

In an optional embodiment, the first conductive layer includes: an inorganic layer close to the substrate, and a first metal layer on a side of the inorganic layer facing away from the substrate.

In an optional embodiment, the second conductive layer includes: a second metal layer close to the substrate; and a third metal layer located on a side of the second metal layer facing away from the substrate.

In an optional embodiment, a thickness of the first conductive portion is greater than the thickness of the second conductive portion; a ratio of the thickness of the first conductive portion to the thickness of the second conductive portion is greater than or equal to 5, and less than or equal to 7.

In an optional embodiment, the second insulation layer includes: a first inorganic layer; an organic layer located on a side of the first inorganic layer facing away from the substrate; and a second inorganic layer located on a side of the organic layer facing away from the substrate.

In an optional embodiment, the first conductive portion includes a signal line and/or a connection line.

In an optional embodiment, the first conductive portion includes a signal line, the signal line includes the first contact pad corresponding to the first hollowed-out region, and the second conductive layer further comprises multiple connection lines; each of the connection lines is in direct contact with the signal line below through a third opening penetrating through the second insulation layer, so that the second contact pad is electrically connected to the connection line through the signal line; the orthographic projection of the signal line on the substrate overlaps with the orthographic projection of the connection line on the substrate, and the orthographic projection of the signal line on the substrate covers the orthographic projection of the second contact pad on the substrate.

In an optional embodiment, the drive base plate further includes: a third insulation layer located on a side of the second conductive layer facing away from the substrate, the third insulation layer includes a fourth opening, the orthographic projection of the second contact pad on the substrate is within the orthographic projection of the fourth opening on the substrate.

The present disclosure further provides a light-emitting base plate including the multiple electronic elements and the drive base plate; each electronic element among the multiple electronic elements includes at least two pins, each pin of the electronic element being soldered with the first contact pad or the second contact pad on the drive base plate.

In an optional embodiment, the electronic elements include an inorganic light-emitting diode and/or a drive chip; the drive chip is used for driving the inorganic light-emitting diode to emit light.

The present disclosure further provides a display device, including the drive base plate or the light-emitting base plate.

The above description is merely an overview of the technical solutions of the present disclosure. In order to know about the technical means of the present disclosure more clearly and implement the solutions according to the contents of the specification, and in order to make the above-mentioned and other objects, features and advantages of the present disclosure more apparent and understandable, specific implementations of the present disclosure are set forth below.

BRIEF DESCRIPTION OF THE DRAWINGS

In order to describe the embodiments of the present disclosure or the technical solutions in the related art more clearly, the accompanying drawings which are used in the description of the embodiments or the related art will be briefly introduced. Apparently, the accompanying drawings in the following description illustrate some embodiments of the present disclosure, and those skilled in the art may obtain other accompanying drawings according to these accompanying drawings without paying any creative effort. It should be noted that the scales shown in the figures are merely schematic and do not represent actual scales.

DETAILED DESCRIPTION OF THE EMBODIMENTS

In order to make the objects, technical solutions, and advantages of embodiments of the present disclosure clearer, the technical solutions of the embodiments of the present disclosure will be clearly and thoroughly described below in conjunction with the drawings of the embodiments of the present disclosure. Apparently, the described embodiments are a part of the embodiments of the present disclosure, rather than all the embodiments. All other embodiments that are obtained by those skilled in the art based on the embodiments of the present disclosure without involving any creative effort are within the scope of the present disclosure.

In the related art, it needs to be focused on a yield control of Mini LED products, in which the drive base plate is a substrate for supplying power driving to micro light-emitting diodes. In general, the micro light-emitting diodes are arranged in an array on the drive base plate and soldered to the drive base plate. In a LED display device, the drive base plate provides an electrical connection basis for the micro light-emitting diodes.

The adhesive force between various layers of the drive base plate is a factor affecting the yield of Mini LED products. For example, whether the adhesive force between the conductive layer and the insulation layer of the drive base plate is sufficient. If the adhesive force is insufficient, the conductive layer and the insulation layer will be separated, resulting in a problem of poor electrical performance of the Mini LED product.

Therefore, when Mini LED products are manufactured, attention should be paid to the adsorptivity between the conductive layer and the insulation layer. The conductive layer generally includes a pad region and a non-pad region. The pad region is a region used for coupling the conductive layer with other electrical structures such as pins of an electronic element or other conductive layers, and the non-pad region is covered by the insulation layer so as to avoid defects caused by the conductive layer being eroded by water, oxygen, or foreign matter.

Figure 1:
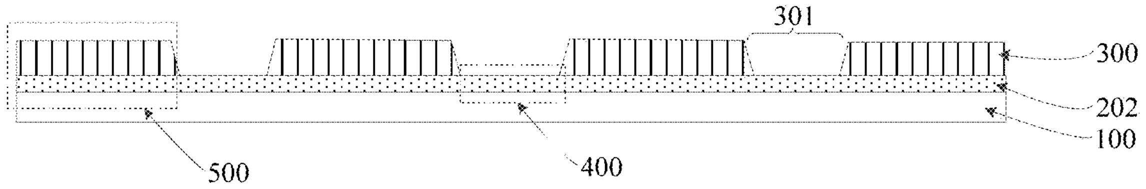
FIG. 1 is a schematic diagram schematically illustrating a pad region and a non-pad region on a conductive layer in a drive base plate in the related art.

For example, FIG. 1 is a schematic diagram illustrating a pad region and a non-pad region on a conductive layer of a drive base plate. As shown in FIG. 1, the drive base plate includes a substrate 100, a first conductive layer 202 disposed on the substrate, and an insulation layer 300 located on a side of the first conductive layer 202 facing away from the substrate. The insulation layer 300 has multiple openings 301, and each opening is used to expose a partial region of the conductive layer. The exposed partial region is a pad region 400, and other regions covered by the insulation layer are called as non-pad regions 500. If the first conductive layer 202 is deposited by a sputtering process, for example, the first conductive layer 202 is formed by depositing metal through the Sputter process, then the surface of the first conductive layer 202 may be oxidized, resulting in insufficient adhesive force between the first conductive layer 202 and the insulation layer 300 in partial regions of the non-pad regions 500. As a result, the first conductive layer 202 and the insulation layer 300 may be separated from each other, thereby affecting the electrical performance of the whole drive base plate, and further affecting the yield of products.

In view of this, the present disclosure provides a drive base plate with improved adhesive force between the conductive layer and the insulation layer that can ensure a product yield. The drive base plate is added with a block layer. The block layer is hollowed out in a contact pad region required to be soldered with an electronic element in the conductive layer so as to expose the contact pad. In a non-hollowed-out region, the block layer can serve as an oxidation-resistant layer between the conductive layer and other film layers, such as the insulation layer. Thus, the conductive layer is on one side of the block layer, and the insulation layer is on the other side of the block layer. The oxidation resistance of the conductive layer can be improved through the block layer, so that the adhesive force with the insulation layer is improved, thereby avoiding detachment between the conductive layer and the insulation layer in the non-pad region, and ensuring the yield of the products.

Figure 2:
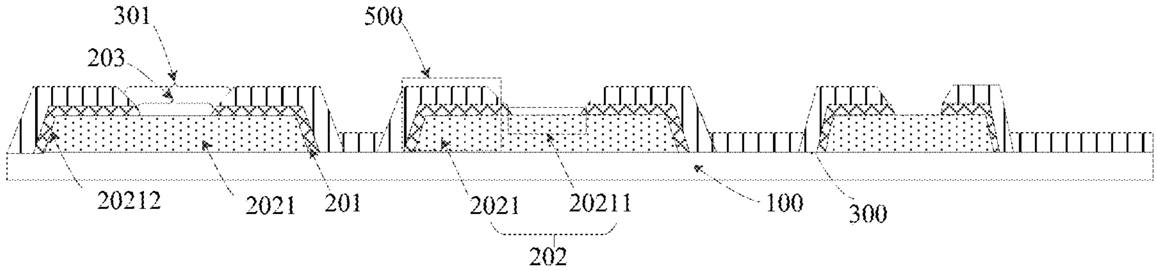
FIG. 2 is a schematic structural diagram schematically illustrating a drive base plate.
Figure 3:
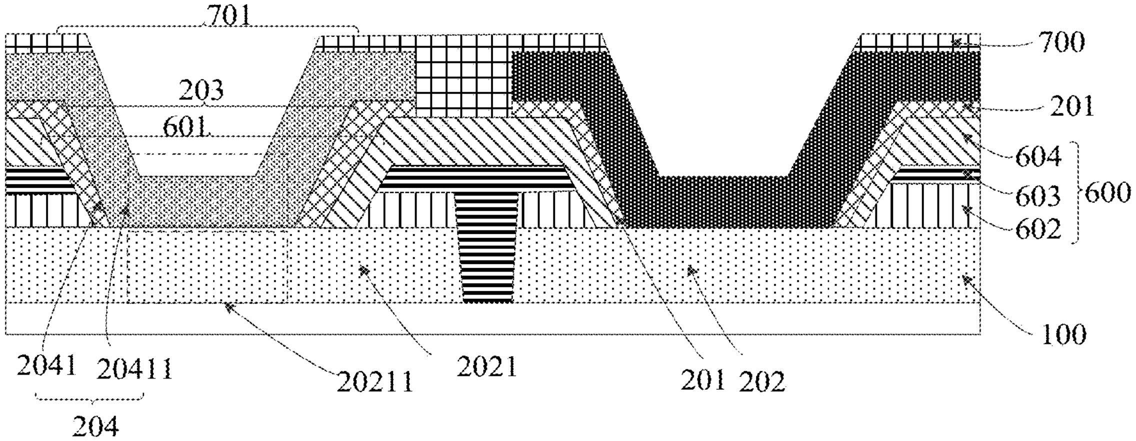
FIG. 3 is a schematic structural diagram schematically illustrating another drive base plate.

Firstly, the present disclosure provides a drive base plate, with reference to FIG. 2 and FIG. 3, which schematically illustrate structures of a drive base plate according to the present disclosure. As shown in FIG. 2 and FIG. 3, the drive base plate may include: a substrate 100; and a first conductive layer 202 and a first block layer 201 stacked on a side of the substrate 100.

The first conductive layer 202 includes multiple first conductive portions 2021 arranged at intervals, and each first conductive portion 2021 includes a first contact pad 20211.

The first block layer 201 includes first hollowed-out regions 203. Each of the first hollowed-out regions corresponds to one first contact pad 20211. The orthographic projection of the first contact pad 20211 on the substrate 100 is within the orthographic projection of the first hollowed-out region 203 on the substrate 100, and the material of the first block layer 201 includes an oxidation-resistant material.

Multiple first conductive portions 2021 are provided in the first conductive layer 202, and a part of the first conductive portion 2021 exposed at the first hollowed-out region 203 is referred to as the first contact pad 20211. In an optional example, the first contact pad 20211 may be the entire region of the first conductive portion 2021, or may be a partial region of the first conductive portion 2021.

In yet another optional example, the thickness of the first contact pad 20211 may be slightly greater than the thickness of other parts of the first conductive portion 2021, e.g., the thickness of the first contact pad is about 1 μm greater than the thickness of other parts of the first conductive portion. In this way, the thickness of the first contact pad 20211 may be increased to provide sufficient soldering thickness for soldering electronic elements. Of course, the thickness of the first contact pad 20211 may be equal to the thickness of other parts of the first conductive portion 2021, which is not particularly limited in the present disclosure.

Regions other than the first hollowed-out regions 203 in the first block layer 201 can improve the oxidation resistance protection of the first conductive layer 202. As shown in FIG. 2, for a region other than the first contact pad 20211 in the first conductive portion 2021 (hereinafter referred to as a non-pad region), when the non-pad region needs to lap over other film layers, such as the insulation layer, the first block layer 201 can be located between the non-pad region and the insulation layer, so as to prevent the non-pad region from separating from the insulation layer due to the oxidation. Thus, the adhesive force between the non-pad region and the insulation layer can be improved and the yield of products can be ensured.

In an optional example, the first conductive layer 202 together with the first block layer 201 may form a laminated structure, i.e., during the preparation, the first conductive layer 202 and the first block layer 201 may be incorporated into the conductive layer preparation process such that the first block layer 201 becomes a laminate of the first conductive layer 202.

In this case, the first conductive layer 202 may also be a laminated structure or a single-layer structure. In the case of a single-layer structure, the host material of the first conductive layer 202 is Cu (in the case of a laminated structure, the first conductive layer 202 may be a laminated structure including multiple metals or metal alloys, for example a laminated structure including a first sub-layer with Cu as the host material that is relatively close to the substrate and a second sub-layer constituted of Ni alloy (e.g. nickel-copper alloy) that is relatively far away from the substrate.)

In this embodiment, the first block layer 201 is used for improving the oxidation resistance of the first conductive layer 202, and may be made of an oxidation-resistant material. Specifically, the first block layer 201 may be made of a metal alloy having oxidation-resistant properties, such as a molybdenum-niobium alloy. Of course, in other embodiments, other oxidation-resistant materials, such as a molybdenum-nickel alloy, may also be possible.

In an optional example, the first conductive layer may be formed by depositing a metal material on the substrate by means of sputtering, then a mask pattern for the first block layer is masked on the first conductive layer through a masking process, and then oxidation-resistant materials can be coated, according to the mask pattern, on the first conductive layer to form the first block layer with the first hollowed-out region.

Specifically, the first block layer is hollowed-out at a position where the first contact pad is located, namely, no oxidation-resistant material is coated in the region where the first contact pad needs to be exposed, and the first block layer is not hollowed-out at the non-pad region, namely, the oxidation-resistant material is coated in the non-contact pad region. Therefore, the first block layer can serve as an oxidation-resistant coating layer for the first conductive layer, and the oxidation-resistant coating layer can be disposed on the top of the first conductive layer or on the bottom of the first conductive layer. FIG. 2 illustrates the case where the first block layer is disposed on the top of the first conductive layer, as shown in FIG. 2, in the non-pad region, the first block layer is in contact with the first insulation layer to prevent the conductive layer from separating from the first insulation layer due to the oxidation.

In an optional example, a schematic layout between the first conductive layer 202 and the insulation layer when the insulation layer is provided on the substrate is presented.

As shown in FIG. 2, FIG. 2 illustrates schematic positions between the first conductive layer 202 and the first insulation layer 300, that is to say, the drive base plate further includes the first insulation layer 300.

The first block layer 201 is disposed on a side of the first conductive layer 202 facing away from the substrate 100. The first insulation layer 300 is disposed on a side of the first block layer 201 facing away from the substrate 100, and the first insulation layer 300 is provided with a first opening 301. The orthographic projection of the first hollowed-out region 203 on the substrate 100 is located in the orthographic projection of the first opening 301 on the substrate 100. A surface of the first contact pad 20211 facing away from the substrate 100 is exposed.

Specifically, the first block layer 201 is located on the side of the first conductive layer 202 facing away from the substrate, and the first insulation layer 300 is located on the side of the first block layer 201 facing away from the substrate. That is, the first block layer 201 may be provided close to the first insulation layer 300. Here, it could be understood that neither the orthographic projection of the first block layer 201 on the substrate 100 nor the orthographic projection of the first insulation layer 300 on the substrate 100 overlaps with the orthographic projection of the first contact pad 20211 on the substrate 100. The first block layer 201 may provide oxidation resistance protection for the non-pad region in the first conductive layer 202, and the adhesive force between the first block layer 201 and the first insulation layer 300 may be greater than the adhesive force between the first conductive layer 202 and the first insulation layer 300.

As shown in FIG. 2, the first hollowed-out region 203 is provided in the first block layer 201. Accordingly, the first insulation layer 300 is provided with the first opening 301 at a position corresponding to the first hollowed-out region 203. The first contact pad 20211 is exposed in an opening region formed jointly by the first hollowed-out region 203 and the first opening 301, thereby forming a pad of the drive base plate.

The first insulation layer 300 may include multiple first openings 301, through which exposed regions may be provided for multiple first contact pads 20211. Each first contact pad may be regarded as a conductive region. The first conductive portion 2021 is covered by the first block layer in the region other than the first contact pad 20211, and the first block layer 201 is further covered by the first insulation layer 300. As such, to ensure sufficient exposure of the first contact pad 20211, the orthographic projection of the first hollowed-out region 203 on the substrate 100 is within the orthographic projection of the first opening 300 on the substrate 100, and the orthographic projection of the first contact pad 20211 on the substrate 100 is within the orthographic projection of the first hollowed-out region 203 on the substrate 100, thereby sufficiently exposing the first contact pad for the convenience of soldering an electronic element.

As shown in FIG. 2, since the first conductive layer 202 together with the first block layer 201 may form a laminated structure, the first block layer 201 may be on the top of the first conductive layer 202 in the non-pad region 500.

Since the adhesive force between the first block layer 201 and the first insulation layer 300 is greater than the adhesive force between the other laminated layers 202 in the first conductive layer 202 and the first insulation layer 300, the first insulation layer 300 is provided close to the first block layer 201. On the one hand, the problem of low adhesive force of the first conductive layer due to the oxidation can be prevented; on the other hand, since the adhesive force between the first block layer and the first insulation layer is great, and the first conductive layer and the first block layer can be a laminated structure prepared through the same process, the adhesive force between the first block layer and the first conductive layer, as well as between the first insulation layer, is relatively large, thus avoiding the problem of the non-pad region in the first conductive layer separating from the first insulation layer when the first conductive layer is in direct contact with the first insulation layer.

In an embodiment, as shown in FIG. 2, there may be only one layer of the first conductive layer, the first conductive layer may be obtained by depositing a corresponding metal material on the substrate through a sputtering process, and the metal may be copper; then the first block layer is provided on a side of the first conductive layer in the non-pad region facing away from the substrate, and the first insulation layer is provided on a side of the first block layer facing away from the substrate, that is to say, in this case, the first block layer is the top layer of the first conductive layer, and is in contact with the first insulation layer.

Further, in the non-pad region, the first block layer 201 may completely cover the non-pad region of the first conductive portion 2021 in the first conductive layer 202 below. In this way, the problem of retraction of the first block layer can be avoided, that is to say, a sufficient retraction space is left for the first block layer, so that even if the first block layer is partially retracted, since it completely covers the non-pad region of the first conductive portion 2021, the first block layer will not retract into the edge of the conductive layer, and thus the protective effect of the first block layer on the conductive layer can be improved, thereby improving the yield of products.

Specifically, the first block layer covers at least a side surface of any of the first conductive portions, the side surface being multiple faces adjoining the bottom face of any of the first conductive portions facing the substrate.

The side surface of the first conductive portion refers to a face adjoining the bottom surface facing the substrate 100 and the bottom surface of the substrate 100. As shown in FIG. 2, the side surface may be a face shaped like the side surface 20212, i.e., from a cross-sectional view, the side surface may be a slope adjoining the substrate 11, and the first block layer 201 is also covered on the slope.

When preparing the drive base plate as shown in FIG. 2, the first conductive layer 202 may be prepared on the substrate 100 through a sputtering process. The first conductive layer 202 includes multiple spaced first conductive portions 2021, and then the first block layer 201 is formed on the first conductive layer 202. When the first block layer 201 is formed, a mask pattern of the first block layer may be formed on the first conductive layer by a masking process, and then an oxidation-resistant material may be coated on the first conductive layer according to the mask pattern, thereby forming the first block layer 201 with first hollowed-out regions 203. One first hollowed-out region 203 corresponds to one first conductive portion 2021, the part of the first conductive portion 2021 exposed by the first hollowed-out region 203 is the first contact pad 20211. Next, the first insulation layer 300 is formed on the first block layer 201. When the first insulation layer 300 is formed, the first opening 301 may be patterned first so that the first insulation layer 300 has the first opening 301 at the first contact pad 20211 to expose the first contact pad.

The first contact pad may be set to have a thick thickness, for example 3.6 μm~7 μm, so that soldering may be performed by directly using the remaining conductive layer below the first contact pad when poor soldering occurs in an electronic element and the electronic element needs to be reworked and subjected to die bonding again.

In the related art, if an electronic element is abnormal due to poor soldering, and needs to be repaired and re-soldered, then the metal of the pad region is removed together with the electronic element during the desoldering process since the solder paste and the metal of the pad region form an IMC (intermetallic compound) layer of 0.9 μm~1.2 μm during the first die bonding. Therefore, the die bonding cannot be performed again if there is no metal remaining in the pad region.

In the present disclosure, a dual-conductive-layer design is provided to address the reworking problem of die bonding of an electronic element by increasing the metal thickness on the pad through the dual-conductive-layer. Accordingly, in the dual-conductive-layer design, the first insulation layer is provided between two conductive layers in the non-pad region. The first block layer may be provided between the first insulation layer and the top conductive layer. Of course, in order to further improve the yield of the products, a second block layer may also be added between the first insulation layer and the underlying conductive layer.

In the case that two conductive layers are provided, the first conductive layer and the second conductive layer may be prepared through different processes or may be prepared by the same process. The first conductive layer may be a laminated structure or a single layer structure. When the first conductive layer is a single layer, the host material of the second conductive layer is Cu, and when the first conductive layer is a laminated structure, the second conductive layer may be a stacked structure including multiple metals or metal alloys, for example including a first sub-layer with Cu as the host material that is relatively close to the substrate and a second sub-layer constituted of Ni alloy (e.g., nickel-copper alloy) that is relatively far away from the substrate.

In an optional example, with regard to the first conductive layer, the electroplating process may be used to electroplate metal, such as copper, on the substrate to obtain the underlying conductive layer, and the second conductive layer may be obtained by depositing metal through the sputtering process. In the optional example, the first conductive layer is obtained by electroplating metal on the substrate through the electroplating process, the electroplating process makes the conductive layer itself have a strong oxidation resistance. Therefore, a block layer may not be provided on the top of the first conductive portion of the first conductive layer, and the first block layer is provided on a side of the second conductive layer close to the first insulation layer. Likewise, the first block layer is hollowed-out at a position corresponding to the first contact pad, so that the second conductive portion in the second conductive layer passes through the first hollowed-out region to lap over the first contact pad, thereby forming a pad with a thick thickness. That is, the first block layer is provided on the bottom layer of the second conductive layer. In this way, the process flow can be shortened to a certain extent such that the preparation costs are reduced while the yield of products is ensured.

Accordingly, in the dual-conductive-layer design, two conductive layers, i.e., the first conductive layer and the second conductive layer, are included. The first block layer is located between the first conductive layer and the second conductive layer, the second conductive layer has multiple conductive portion groups, each conductive portion group of the multiple conductive portion groups includes at least two second conductive portions, and the second conductive portion includes a second contact pad; the second contact pad passes through the first hollowed-out region to directly lap over the first contact pad, and the surface of the second contact pad facing away from the substrate is exposed.

In this embodiment, each conductive portion group may correspond to a soldering requirement of one electronic element, or may correspond to soldering requirements of multiple electronic elements. Specifically, the electronic element includes at least two pins. Accordingly, each conductive portion group may include at least two second conductive portions, and each conductive portion corresponds to one pin of one electronic element.

The second conductive portion includes a second contact pad that is a part of the second conductive portion exposed at the first hollowed-out region. In this case, the first contact pad is also a part of the first conductive portion exposed at the first hollowed-out region, and then the second contact pad may directly lap over the first contact pad so as to form a pad for soldering one pin of the electronic element. It can be understood that the film layer structure of the second contact pad is the same as the film layer structure of the second conductive portion; alternatively, the film structure of the second contact pad is different from the film structure of the second conductive portion, for example, the second conductive portion is a laminated structure including a copper layer and a nickel alloy layer, and the second contact pad is a single layer structure including only a copper layer, which is not limited herein.

In the present embodiment, when the first conductive layer and the second conductive layer are provided, the electrical insulation needs to be provided between the two conductive layers in the non-contact-pad region, that is, an insulation layer needs to be provided between the two conductive layers in the non-pad region. In this way, the first block layer needs to be located between the first conductive layer and the second conductive layer to improve the adhesive force between the first conductive layer/the second conductive layer and the insulation layer.

In an optional example, the first conductive layer and the second conductive layer may be stacked. The first conductive layer may be disposed close to the substrate, and the second conductive layer may be located on a side of the first conductive layer facing away from the substrate. In this case, the first contact pad is served as a backing layer for the second contact pad. Alternatively, the second conductive layer may be disposed close to the substrate, and the first conductive layer may be located on a side of the second conductive layer facing away from the substrate. In this case, the second contact pad is served as a backing layer for the first contact pad. In either case, the first block layer is located between the first conductive layer and the second conductive layer to help the first conductive layer or the second conductive layer improve oxidation resistance, thereby helping to improve the adhesive force between the first conductive layer/the second conductive layer and the insulation layer.

When reworking is required due to the poor soldering between the pad (the laminated structure of the first contact pad and the second contact pad) and the pin of the electronic element, the first contact pad or the second contact pad serving as a “backing” standby component is more helpful in ensuring the reliability of re-installation, and solving the problem that the pad cannot be re-soldered.

When the second conductive layer is located on a side of the first conductive layer facing away from the substrate, the second conductive layer in conjunction with the first block layer may form a laminated structure. The first block layer may be served as the bottom layer of the second conductive layer.

Reference is made to FIG. 3, which is a schematic diagram illustrating that the second conductive layer is located on a side of the first conductive layer facing away from the substrate, and a second insulation layer is provided between the second conductive layer and the first conductive layer. As shown in FIG. 3, the first conductive layer 202 and the second conductive layer 204 are included; a second insulation layer 600 is located on a side of the first conductive layer facing away from the substrate; the first block layer 201 is located on a side of the second insulation layer 600 facing away from the substrate; the second conductive layer 204 is located on a side of the first block layer 201 facing away from the substrate 100; the second insulation layer 600 includes multiple second openings 601; the second contact pad 20411 passes through the first hollowed-out region 203 and the second opening 601 and directly laps over the first contact pad 20211.

The orthographic projection of the second opening 601 on the substrate 100 is within into orthographic projection of the first hollowed-out region 203 on the substrate.

The second insulation layer 600 includes multiple second openings 601. As mentioned above, respective pad regions for the first conductive portion 2021 and the second conductive portion 2041 may be reserved through the second opening 601. As shown in FIG. 3, the parts of the first conductive portion 2021 and the second conductive portion 2041 exposed in the first hollowed-out region 2006 are referred to as the first contact pad 20211 and the second contact pad 20411, and the second contact pad 20411 directly laps over the first contact pad 20211; and the second insulation layer 600 and the first block layer 201 are successively arranged between the respective regions (non-pad regions) of the first conductive portion 2021 and the second conductive portion 2041 other than the contact pads. That is, in the non-pad region, the first conductive layer 202 and the second conductive layer 204 are separated by the second insulation layer 600. The first block layer 201 is included between the second conductive layer 204 and the second insulation layer 600. The first block layer 201 can improve the adhesive force between the second conductive layer 204 and the second insulation layer 600.

It needs to be noted that the laminated structure of the second contact pad 20411 and the first contact pad 20211 needs to be sufficiently exposed in this case, thus the orthographic projection of the laminated structure of the second contact pad 20411 and the first contact pad 20211 on the substrate is within the orthographic projection of the first hollowed-out region 203 on the substrate. Further, since the first block layer 201 is located on a side of the second insulation layer 600 facing away from the substrate, the orthographic projection of the laminate of the second contact pad 20411 and the first contact pad 20211 on the substrate is within the orthographic projection of the second opening 601 on the substrate so as to sufficiently expose the laminated structure of the second contact pad 20411 and the first contact pad 20211.

Accordingly, when two conductive layers are provided, a third insulation layer 700 may be disposed on a side of the second conductive layer 204 facing away from the substrate. The orthographic projection of the third insulation layer 700 on the substrate 100 does not overlap with the orthographic projection of the laminate of the second contact pad 20411 and the first contact pad 20211 on the substrate 100.

The second insulation layer 600 may have a laminated structure, and the third insulation layer 700 may have a laminated structure or a single layer of PVX layer instead of a laminated structure.

As shown in FIG. 3, a fourth opening 701 is provided in the third insulation layer 700 as the top layer, and the orthographic projection of the second contact pad 20411 on the substrate is within the orthographic projection of the fourth opening 701 on the substrate. Specifically, the orthographic projection of the first hollowed-out region 203 on the substrate 100 is within the orthographic projection of the first opening 301 on the substrate 100, and the orthographic projection of the second contact pad 20411 on the substrate is further within the orthographic projection of the first hollowed-out region 203 on the substrate, so as to sufficiently expose the pad.

When the drive base plate as shown in FIG. 3 is prepared, the first conductive layer 202 may be formed on a side of the substrate 100, and the first conductive layer 202 may be obtained by electroplating a metal layer with Cu as the host material on the substrate through an electroplating process. Next, the second insulation layer 600 is formed on a side of the first conductive layer 202 facing away from the substrate 100, the first block layer 201 is formed on a side of the second insulation layer 600 facing away from the substrate 100, and the second conductive layer 204 is formed on a side of the first block layer 201 facing away from the substrate 100; the third insulation layer 700 is formed on a side of the second conductive layer 204 facing away from the substrate. The second conductive layer 204 and the first conductive layer 202 constitute double conductive layers, so that a laminated structure of the first contact pad and the second contact pad is formed, thereby increasing the thickness of the pad region for facilitating a secondary rework occurring at the die bonding stage.

Figure 4:
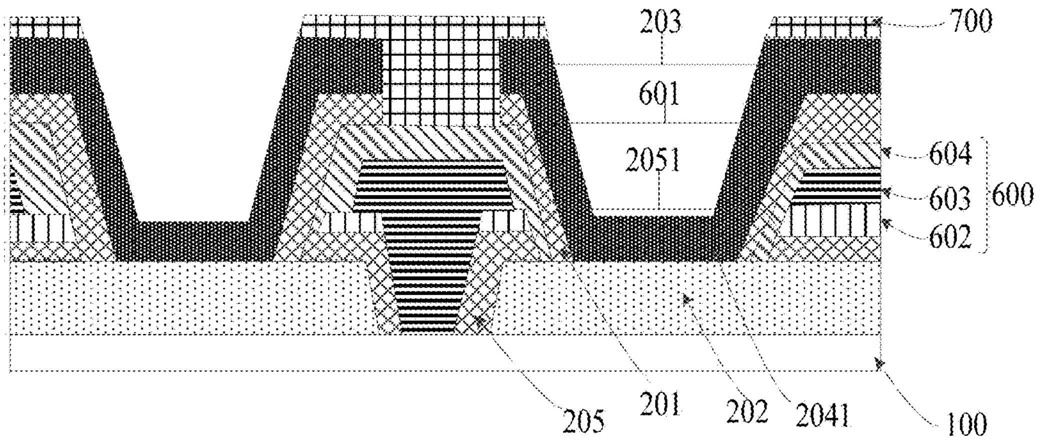
FIG. 4 is a schematic structural diagram schematically illustrating another drive base plate.

In yet another optional example, referring to FIG. 4, if the first conductive layer 202 is obtained by depositing a metal on a substrate through a sputtering process, the second conductive layer 204 is also obtained by depositing a metal through a sputtering process. In the optional example, a second block layer may also be provided between the first conductive layer and the second insulation layer, the material of the second block layer includes an oxidation-resistant material.

The second block layer includes a second hollowed-out region. The second contact pad passes through the first hollowed-out region, the second opening, and the second hollowed-out region in sequence, and directly laps over the first contact pad. The orthographic projection of the second opening on the substrate is located within the orthographic projection of the second hollowed-out region on the substrate.

In such an embodiment, the second block layer 205 may be disposed on a side of the first conductive layer 202 close to the second insulation layer 600.

Specifically, the first conductive layer 202 and the second block layer 205 may form a laminated structure, and the second conductive layer 204 and the first block layer 201 may form a laminated structure. In this way, the second block layer 205 may serve as the top layer of the first conductive layer 202, and the first block layer 201 may serve as the bottom layer of the second conductive layer 204. It needs to be noted that the second block layer 205 includes a second hollowed-out region 2051. The orthographic projection of the second opening 601 on the substrate is located in the orthographic projection of the second hollowed-out region 2051 on the substrate, and the orthographic projection of the first hollowed-out region 203 on the substrate is located within the orthographic projection of the second opening 601 on the substrate. That is, in terms of sizes, the second hollowed-out region 2051 is larger than the second opening 601, and the second opening 601 is greater than the first hollowed-out region 203.

The second contact pad 20411 in the second conductive portion 2041 passes through the first hollowed-out region 203, the second opening 601, and the second hollowed-out region 2051 in sequence, and directly laps over the first contact pad 20211.

By adopting the drive base plate of this example, with regard to the first conductive portion and the second conductive portion of the same group, the first conductive portion, the second block layer, the second insulation layer, and the second conductive portion are stacked on the substrate in sequence in the non-pad region, and the first contact pad and the second contact pad directly lap in the pad region to constitute a pad for soldering the pin of the electronic element. Accordingly, in the non-pad region, the second insulation layer is in contact with the first block layer and the second block layer at two sides of the second insulation layer respectively. Therefore, it is possible to improve the adhesive force between the first conductive layer and the second insulation layer, and improve the adhesive force between the second conductive layer and the second insulation layer, thereby improving the adhesive force of the conductive layer of the entire drive base plate and ensuring the yield.

When the drive base plate as shown in FIG. 4 is prepared, the first conductive layer 202 may be formed on a side of the substrate 100. The first conductive layer 202 may be prepared through a sputtering process. Next, the second block layer 205 is formed on the first conductive layer 202, then the second insulation layer 600 is formed on a side of the second block layer 205 facing away from the substrate 100, the first block layer 201 is further formed on a side of the second insulation layer 600 facing away from the substrate 100, and the second conductive layer 204 is formed on a side of the first block layer 201 facing away from the substrate 100; the second insulation layer 700 is formed on a side of the second conductive layer 204 facing away from the substrate. The second contact pad in the second conductive layer 204 and the first contact pad in the first conductive layer 202 constitutes double conductive layers, so that the thickness of the pad region can be increased for facilitating a second rework occurring at the die bonding stage.

In the optional example, two conductive layers are included, the thickness of the first conductive portion 2021 is greater than the thickness of the second conductive portion 2041. Specifically, the thickness of the first conductive portion may range from 3.6 μm to 4.32 μm, and the thickness of the second conductive portion may range from 0.6 μm to 0.72 μm. That is, the ratio of the thickness of the first conductive portion to the thickness of the second conductive portion is greater than or equal to 5, and less than or equal to 7.

For example, the thickness of the first conductive portion may be 3.6 μm, and the thickness of the second conductive portion may be 0.6 μm; or, the thickness of the first conductive portion may be 4.32 μm, and the thickness of the second conductive portion may be 0.6 μm; or, the thickness of the first conductive portion may be 3.6 μm and the thickness of the second conductive portion may be 0.72 μm; or, the thickness of the first conductive portion may be 4.32 μm and the thickness of the second conductive portion may be 0.72 μm.

In an optional example, the specific structures of the first conductive layer and the second conductive layer are described. The first conductive layer may be a laminated material, and may include: an inorganic layer close to the substrate; and a first metal layer located on a side of the inorganic layer facing away from the substrate.

The inorganic layer may be made of a material selected from materials with good adhesive force to the substrate, for example, a molybdenum-niobium material, and the first metal layer may be a copper layer. Thus, a laminated material such as MoNb/Cu is formed, and the molybdenum-niobium layer is used for improving the adhesive force to the substrate below. As stated above, the first metal layer Cu is used for transferring an electrical signal, and may be obtained by electroplating or sputtering. When the first metal layer is obtained by electroplating, a seed layer MoNiTi may be formed first to increase the grain nucleation density, and an oxidation-resistant layer MoNiT is then manufactured after electroplating.

The thickness of the inorganic layer may be 300 angstroms, and the thickness of the first metal layer may be 3.6 μm. Therefore, the thickness of the bottom conductive layer is made to be greater than the thickness of the top conductive layer.

Of course, in an embodiment, since the first conductive layer and the second block layer may form a laminated structure, the first conductive layer and the second block layer may form a laminated material such as MoNb/Cu/MoNb, the second block layer being the top layer and being hollowed-out at the position of the first contact pad.

Correspondingly, the second conductive layer includes: a second metal layer close to the substrate; and a third metal layer located on a side of the second metal layer facing away from the substrate.

In this embodiment, the material of the second conductive layer may be a laminated material, for example, a laminated material of Cu/CuNi, Cu being mainly used to ensure that the second conductive layer has a low electrical resistance, and CuNi being able to balance oxidation resistance and die bond fastness. That is, the second metal layer is a Cu layer, and the thickness of the second metal layer may be 0.6 μm; the third metal layer is a CuNi layer, and the thickness of the third metal layer may be 500 angstroms.

In yet another optional example, as shown in FIG. 3 and FIG. 4, a structure of the second insulation layer 600 is illustrated. The second insulation layer 600 includes: a first inorganic layer 602 close to the substrate; an organic layer 603 located on a side of the first inorganic layer 602 facing away from the substrate 100; and a second inorganic layer 604 located on a side of the organic layer 603 facing away from the substrate 100.

The first inorganic layer may be an inorganic layer made of waterproof materials, the organic layer may be an OC material, and the second inorganic layer may also be made of waterproof materials. The first inorganic layer and the second inorganic layer can slow down the invasion speed of water and oxygen to the pad region and improve the reliability of the drive base plate.

The thickness of the first inorganic layer may be greater than that of the second inorganic layer, so that the stability of the drive base plate may be improved. For example, the thickness of the first inorganic layer may be 2400 angstroms, the thickness of the organic layer may be 7.5 μm, and the thickness of the second inorganic layer may be 1200 angstroms.

Figure 8:
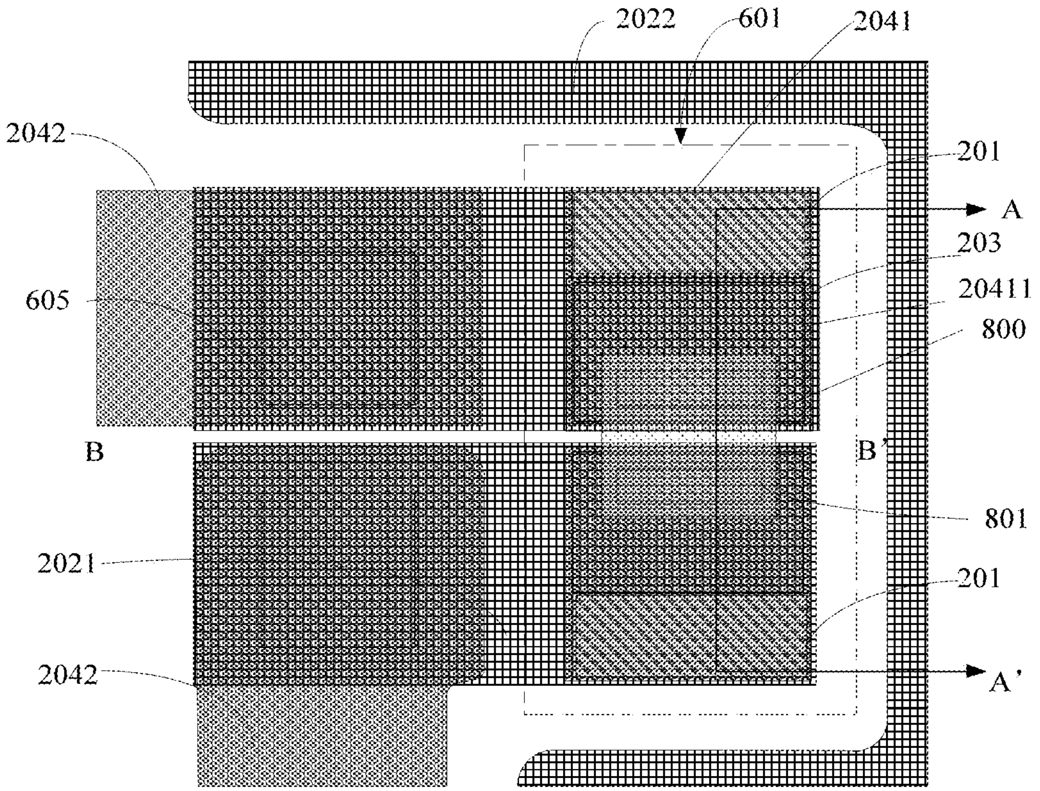
FIG. 8 is a partially enlarged view of the light-emitting base plate shown in FIG. 7.

Of course, in yet another embodiment, as shown in FIG. 8, the first conductive layer may include a signal line 2022 and/or a connection line 2042. When the first conductive layer of a single layer is provided on the substrate, the first conductive layer includes a signal line for providing a driving signal to the drive base plate; and a connection line for providing an electrical connection between pads inside the drive base plate, such as connecting multiple pads in series, so as to realize a series connection or a parallel connection of multiple electronic elements. In this case, the signal line and the connection line may be provided in the same layer as the first conductive portion.

When the first conductive layer and the second conductive layer are provided on the substrate, the first conductive layer may include the signal line for providing the driving signal to the drive base plate, and the second conductive layer may include the connection line. In this case, the signal line is provided in the same layer as the first conductive portion of the first conductive layer, and the connection line is provided in the same layer as the second conductive portion of the second conductive layer.

Specifically, the signal line may provide various driving power line connections required by electronic elements soldered on the drive base plate, such as electrical connections to a common voltage line GND, a driving voltage line VLED, a source power line VSS, a source address line DI, a clock signal line CLOCK, a data line DATA, etc. so that the drive base plate can provide a complete electrical driving performance for the electronic elements.

Figure 5:
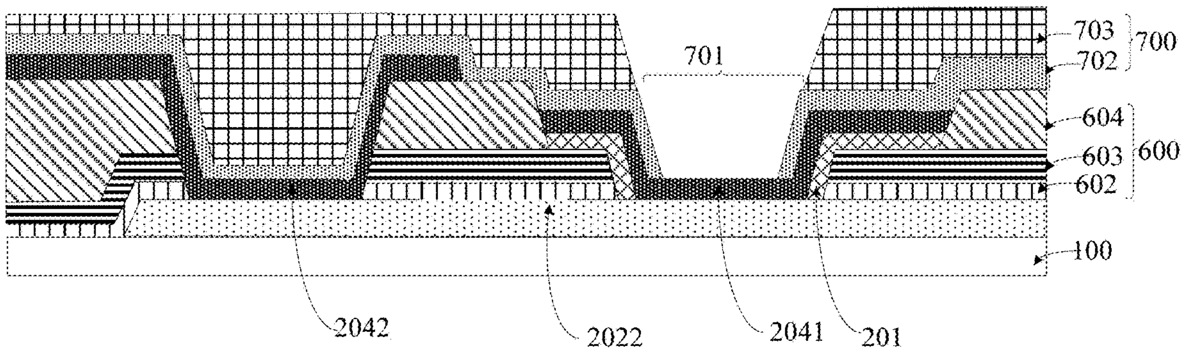
FIG. 5 is a schematic structural diagram schematically illustrating a drive base plate including signal lines.
Figure 7:
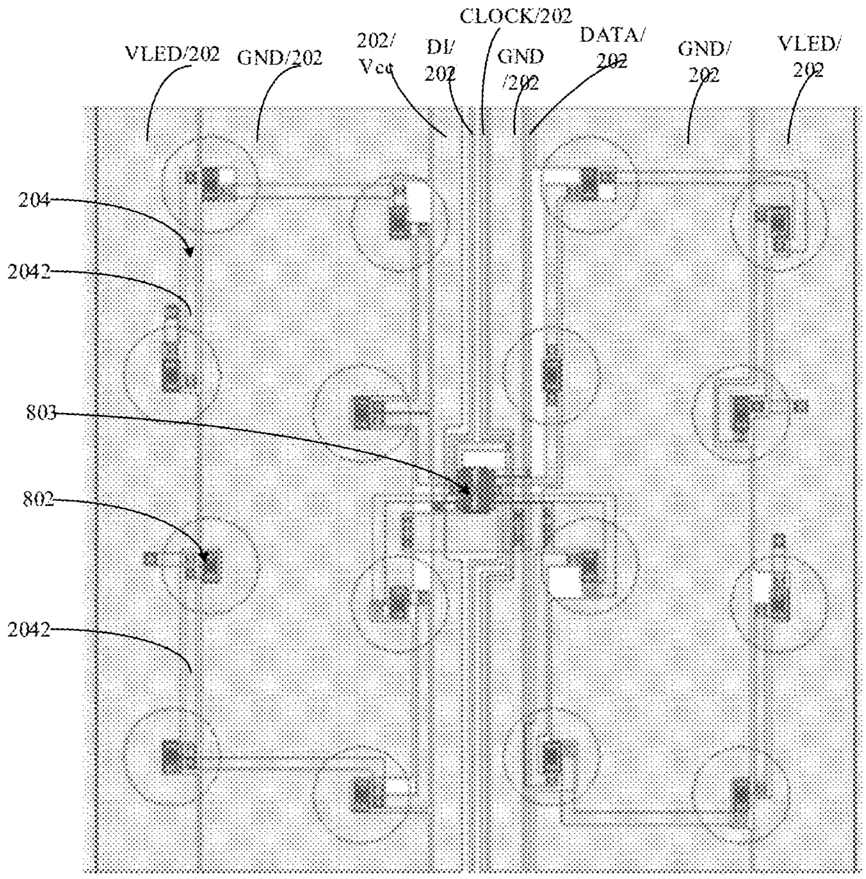
FIG. 7 is a top view schematically illustrating a light-emitting base plate.

As shown in FIGS. 5 and 7, the conductive layer includes two conductive layers. The second conductive layer 204 may include multiple connection lines 2042 arranged in the same layer as the second conductive portion 2041. The first conductive portion includes a signal line 2022, that is to say, a part of the first conductive portion 2021 is a signal line (a common voltage line GND, a driving voltage line VLED, a source power line VCC, a source address line DI, a clock signal line CLOCK, and a data line DATA), and a part of the signal line exposed by the first hollowed-out region is the first contact pad 20211. Specifically, the second conductive layer further includes multiple connection lines.

It needs to be noted that a side of the connection line 2042 facing away from the substrate is covered by the third insulation layer 700, so that the third insulation layer 700 can prevent an interference electrical signal from interfering with the connection line 2042. The third insulation layer may be a laminated structure, and as shown in FIG. 5, may include an inorganic layer 702 and an organic layer 703. The material of the inorganic layer 702 includes at least one of silicon nitride and silicon oxide, and the material of the organic layer 703 may be an organic resin.

In this way, a series connection or a parallel connection between multiple pads can be realized via the connection lines 2042 so as to realize a series connection or a parallel connection of multiple electronic elements when the electronic elements are subsequently soldered. Further, the signal line can provide a common ground, a common voltage, a clock signal, etc. Therefore, through lap-joints of the connection line and the signal line, the common ground, common voltage, clock signal, etc. provided by the signal line can be transferred to the electronic elements via pads, and then simultaneously transferred to multiple electronic elements connected in series or in parallel via the connection line. In this way, the drive base plate can provide a complete electrical driving performance for the electronic elements.

Based on the drive base plate described above, the present disclosure further provides a light-emitting base plate including multiple electronic elements and the drive base plate according to the above embodiments. Each electronic element includes at least two pins, and one pin of each electronic element is soldered with one pad region to electrically connect the electronic element with the drive base plate.

Figure 6:
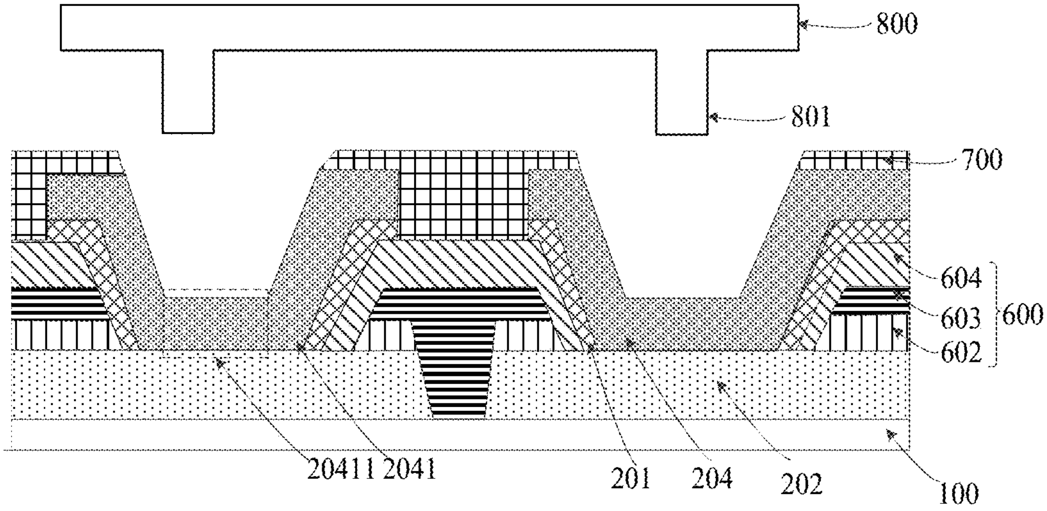
FIG. 6 is a schematic structural diagram schematically illustrating a light-emitting base plate.

Reference is made to FIG. 6, which is a schematic structural diagram illustrating a light-emitting base plate according to the present disclosure. As shown in FIG. 6, the light-emitting base plate includes a drive base plate and multiple electronic elements, each electronic element among the multiple electronic elements includes at least two pins, and each pin of the electronic element is soldered with the first contact pad or the second contact pad on the drive base plate.

As shown in the schematic diagram of FIG. 6, the drive base plate includes two conductive layers. As described in the above-mentioned embodiment, the first conductive layer 202 and the second conductive layer 204 are included. The second conductive layer includes multiple conductive portion groups. Each conductive portion group corresponds to one or more electronic elements. Each conductive portion group includes at least two second conductive portions 2041, and a part of each second conductive portion 2041 exposing the first hollowed-out region 203 is the second contact pad. In this way, each second conductive portion group includes at least two second contact pads, so that the soldering of at least one electronic element can be achieved. The first conductive layer 202 includes multiple first conductive portions. A part of the first conductive portion exposing the first hollowed-out region 203 is the first contact pad. The second contact pad laps over the first contact pad so as to form a pad of the drive base plate. In this case, an electronic element is soldered with the second contact pad in the pad.

Of course, if reworking is required at the die bonding stage, the second contact pad may be removed so that the pins of the electronic element may be soldered with the first contact pad.

Each contact pad on the drive base plate corresponds to one pin 801 of an electronic element 800. When an electronic element has two or more pins, the electronic element may correspond to multiple contact pads, that is, the number of pins included in an electronic element is the same as the number of the corresponding contact pads, with each pin soldered with one contact pad respectively. The pin may be soldered with the contact pad.

Figure 9:
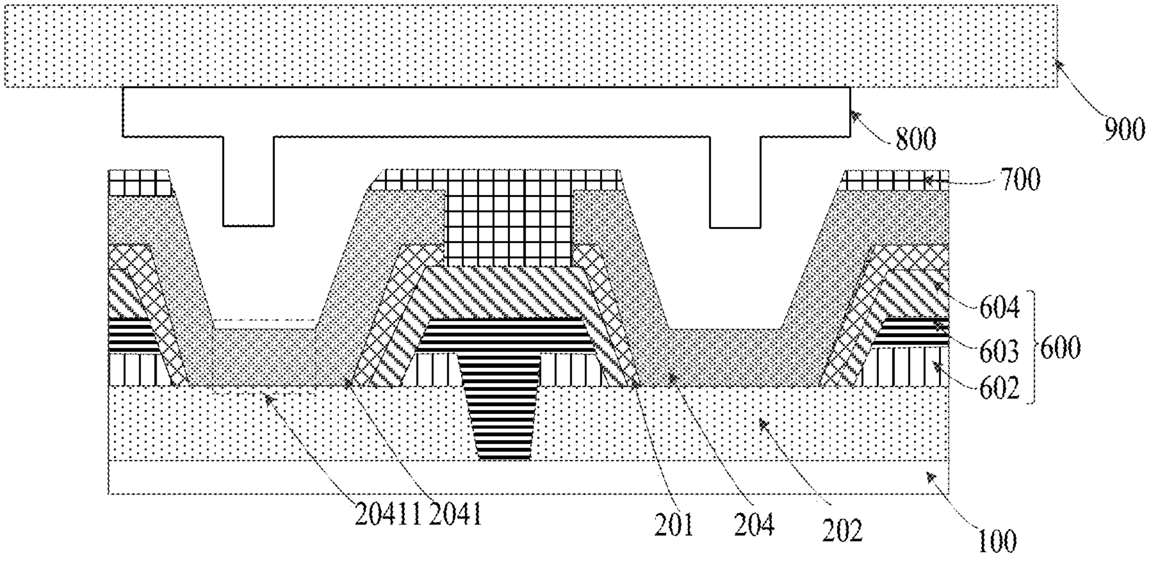
FIG. 9 is a partial cross-sectional view of an array substrate obtained by cutting open a display device shown in FIG. 8 along AA' direction.

The electronic element 800 may completely cover the contact pad. Alternatively, the electronic element 800 may not completely cover the contact pad. FIG. 9 illustrates the case where the contact pad is completely covered.

In some embodiments, with regard to the pins and the first contact pad and the second contact pad, the connection of the pin to the corresponding contact pad may be accomplished through a soldering material (e.g., tin, a tin-silver copper alloy, a tin-copper alloy, etc.) by using a reflow process or a dip soldering process. In the drive base plate provided by the embodiment of the present disclosure, the contact pad may include two conductive layers, if there is poor soldering between the contact pad and the pin of the electronic element and reworking is required, even if the second contact pad is damaged due to the first soldering, the first contact pad located below the second contact pad may serve as a "backing" standby part to ensure the reliability of the subsequent re-installation, thereby solving the problem that the second soldering cannot be performed in the related art, and contributing to improving the yield of products.

In an optional example, for a Mini LED, the electronic elements include an inorganic light-emitting diode and/or a drive chip. The drive chip is used for driving the inorganic light-emitting diode to emit light.

In an instance, the size of the inorganic light-emitting diode is on the order of one hundred microns and less, and the size of the drive chip is on the order of one hundred microns and less. The drive chip has a large number of pins, and can be soldered with multiple pad regions to realize the electrical connection of the drive chip.

FIG. 7 is a top view of a light-emitting base plate according to the present disclosure. As shown in FIG. 7, the light-emitting base plate includes multiple electronic elements 800. The multiple electronic elements 800 include a drive chip 803 and multiple inorganic light-emitting diodes 802. Two pins of the inorganic light-emitting diode 802 are soldered with the corresponding first contact pad or second contact pad, respectively.

In an embodiment, as shown in FIG. 7, every four inorganic light-emitting diodes 802 are connected in series with each other as a group, and one drive chip 803 is configured to provide driving signals to four groups.

FIG. 8 is an enlarged partial view of the light-emitting base plate shown in FIG. 7 (the region where the inorganic light-emitting diode 802 at the third row and the first column is located). The connection line 2042 directly laps over one of the first conductive portions 2021 in the first conductive layer 202 through the third opening 605 of the second insulation layer 600 and a via hole of the first block layer 201, and the first conductive portion is connected with the connection line 2042 and one second contact pad respectively, so that the second contact pad is electrically connected with the connection line 2042. The first block layer 201 is provided between the first conductive portion 2021 and the second conductive portion 2041, the first block layer includes the first hollowed-out region 203. The region of the second conductive portion 2041 exposed by the first hollowed-out region 203 is the second contact pad 20411. The orthographic projection of the first hollowed-out region 203 on the substrate is in the orthographic projection of the second opening 601 on the substrate, and the orthographic projection of the second contact pad 20411 on the substrate is in the orthographic projection of the first hollowed-out region 203 on the substrate.

Two pins 801 of the electronic element 800 are soldered with a second contact pad 20411, respectively.

In an embodiment, as shown in FIGS. 7 and 5, the drive base plate further includes a signal line and a connection line. The signal line may be provided in the same layer as the first conductive portion, and the connection line may be provided in the same layer as the second conductive portion. In this way, the first conductive portion and the multiple signal lines may be simultaneously formed in the same process step, and the connection line and the second conductive portion may be simultaneously formed in the same process step, without increasing the complexity of the manufacturing process of the drive base plate.

When the conductive layer includes two layers, multiple contact pads may be electrically connected to each other through the connection line 2042. Specifically, the connection line 2042 is electrically connected to the signal line (the first conductive portion) below, and the first contact pad 20211 of the signal line and the second contact pad 204111 at the top layer directly lap over so as to achieve the electrical connection between the pad and the connection line 2042. In this way, inorganic light-emitting diodes belonging to the same group may be connected in series or in parallel. For example, as shown in FIG. 7, in the first column, one connection line 2042 is connected to two contact pads so as to connect four inorganic light-emitting diodes 802 in series.

The signal lines provided in the same layer as the first conductive portion may be used for providing signals to the inorganic light-emitting diode and/or the drive chip. Multiple signal lines may include a common voltage line GND, a driving voltage line VLED, a source power line VCC, a source address line DI, a clock signal line CLOCK, a data line DATA, etc. As shown in FIG. 7, multiple signal lines of each of the first conductive layers include the common voltage line GND, the driving voltage line VLED, the source power line VCC, the source address line DI, the clock signal line CLOCK, the data line DATA, etc.

As described in the above embodiments, two pins of the same electronic element may be connected to the same signal line (e.g., the common voltage line GND), then two conductive layers in the contact pads corresponding to the two pins may communicate with each other, for example, to form an integral structure.

The light-emitting base plate provided by the embodiments of the present disclosure may be used to provide electrical drive for a display device of Mini LEDs, and the inorganic light-emitting diode can be used as a light-emitting element, thereby providing a display for the Mini LED.

Of course, in some optional embodiments, as shown in FIG. 7, the light-emitting base plate may further include a protective structure (namely, a circular region in FIG. 7) covering the inorganic light-emitting diode. The protective structure may be prepared by means of dripping or printing using transparent silica gel, and the surface of the protective structure on a side facing away from the substrate may be hemispherical so as to adjust the light emitted by the inorganic light-emitting diode.

With the light-emitting base plate of the present disclosure, on the one hand, the pad of the drive base plate may be a laminated structure formed by the lap joint between the first contact pad and the second contact pad. In this way, the contact pad located below may be used as a "backing" standby part, which ensures the reliability of subsequent re-installation, thereby solving the problem that the pad cannot be re-soldered, and contributing to improving the yield of products. On the other hand, a block layer is added between the insulation layer and the conductive layer in the non-pad region of the drive base plate, so that the oxidation of the non-pad region of the conductive portion is avoided. As a result, the adhesive force between the non-pad region of the conductive portion and the insulation layer is improved, thereby ensuring that the non-pad region of the conductive portion and the insulation layer do not separate from each other to affect the electrical performance of the drive base plate. Therefore, the yield of the light-emitting base plate of the present disclosure is improved, and the light-emitting stability of the light-emitting base plate is ensured.

Accordingly, the present disclosure further provides a display device, including: the drive base plate provided by the present disclosure, or the light-emitting base plate provided by the present disclosure. Of course, in practical assembly, a drive base plate becomes a light-emitting base plate after being soldered with electronic elements, and the light-emitting base plate is assembled with a middle frame and a glass cover plate to form a display device, which can then be used for display.

FIG. 9 is a partial cross-sectional view of an array substrate obtained by cutting open a display device shown in FIG. 8 of the present disclosure along the AA' direction. As shown in FIG. 9, a glass cover plate 900 and a light-emitting base plate attached to a side of the glass cover plate 900 may be included. The light-emitting base plate includes a drive base plate and electronic elements 800 soldered onto the first contact pad or the second contact pad of the drive base plate.

The electronic elements include an inorganic light-emitting diode and a drive chip, and the light-emitting base plate is arranged on a side of the electronic elements facing away from the drive base plate. The drive chip provides a driving signal to the inorganic light-emitting diode, and the inorganic light-emitting diode emits light driven by the driving signal, thereby providing a display.

To prepare the above drive base plate, the present disclosure further provides a manufacturing method for the drive base plate, including steps below:

step 1: providing a substrate; and step 2: forming a first conductive layer and a first block layer on the substrate, the first conductive layer including multiple first conductive portions arranged at intervals, and the first conductive portion including a first contact pad;

the first block layer includes a first hollowed-out region corresponding to each contact pad, and the orthographic projection of the contact pad on the substrate is in the orthographic projection of the first hollowed-out region on the substrate.

Alternatively, in the step of forming a first conductive layer and a first block layer on the substrate, the first block layer may be formed on a side of the first conductive layer facing away from the substrate, then a second conductive layer is formed on a side of the first block layer facing away from the substrate.

The second conductive layer includes multiple conductive portion groups, and each conductive portion group of the multiple conductive portion groups includes at least two second conductive portions. The second conductive portion includes a second contact pad, and the second contact pad passes through the first hollowed-out region, and directly laps over the first contact pad.

Finally, it also needs to be noted that the relational terms such as the first and the second, and the like herein are merely intended to distinguish one entity or operation from another entity or operation without necessarily requiring or implying any actual such relationship or order between such entities or operations. Furthermore, the terms "comprises", "comprising", or any other variation thereof, are intended to cover a non-exclusive inclusion, such that a process, a method, an article, or equipment that comprises a list of elements not only includes those elements but also includes other elements not expressly listed or elements inherent to such process, method, article, or equipment. An element defined by the phrase "including one" does not, without more constraints, preclude the existence of additional identical elements in the process, method, article, or equipment that includes the element.

The above describes a drive base plate, a light-emitting base plate, and a display device provided by the present disclosure in detail. Specific examples are used herein to illustrate the principles and implementation modes of the present disclosure. The description of the above embodiments is only used to help understand the methods and core ideas of the present disclosure; at the same time, for those skilled in the art, according to the idea of the present disclosure, there will be changes in the specific implementation mode and application scope. To sum up, the content of this description should not be understood as a limitation of the present disclosure.

Other implementation modes of the present disclosure will be apparent to those skilled in the art from the consideration of the description and the practice of the application disclosed herein. The present disclosure is intended to cover any variant, use, or adaptive change of the present disclosure. These variants, uses, or adaptive changes follow the general principles of the present disclosure and include the common knowledge or commonly used technical means in the technical field not disclosed in the present disclosure. The description and the embodiments are only regarded as exemplary. The true scope and spirit of the present disclosure are indicated by the following claims.

It should be understood that the present disclosure is not limited to the precise structures described above and shown in the accompanying drawings, and that various modifications and changes may be made without departing from the scope of the present disclosure. The scope of the present disclosure is limited only by the appended claims.

Reference herein to "one embodiment", "an embodiment", or "one or more embodiments" means that a particular feature, structure, or characteristic described in connection with the embodiment is included in at least one embodiment of the present disclosure. In addition, please note that the word example "in one embodiment" does not necessarily refer to the same embodiment.

In the description provided herein, numerous specific details are set forth. However, it could be understood that embodiments of the disclosure may be practiced without these specific details. In some instances, well-known methods, structures, and techniques have not been shown in detail in order not to obscure the understanding of this description.

In the claims, any reference sign placed in a bracket shall not be construed as limiting the claims. The word "comprising" does not exclude the presence of an element or a step other than those listed in a claim. The word "a" or "one" preceding an element does not exclude the presence of multiple such elements. The disclosure can be implemented by means of hardware comprising several distinct elements, and by means of a suitably programmed computer. In a unit claim enumerating several devices, several devices of these devices can be specifically embodied by one and the same item of hardware. The use of the words first, second, third, etc. does not denote any order. These words may be interpreted as names.

Finally, it should be noted that: the above embodiments are provided only to illustrate the technical solutions of the present disclosure, not to limit it; while the present disclosure has been described in detail with reference to the foregoing embodiments, those skilled in the art should understand that: the technical solutions disclosed in the above-mentioned embodiments can still be modified, or some of the technical features can be replaced by equivalents; such modifications and substitutions do not make the essence of the corresponding technical solutions depart from the spirit and scope of the technical solutions of the embodiments of the present disclosure.

The invention claimed is:

1. A drive base plate, comprising:

a substrate; and a first conductive layer and a first block layer disposed on the substrate, wherein the first conductive layer comprises multiple first conductive portions arranged at intervals, and each of the first conductive portions comprises a first contact pad;

wherein the first block layer comprises first hollowed-out regions, each of the first hollowed-out regions corresponds to a respective first contact pad, an orthographic projection of the first contact pad on the substrate is within an orthographic projection of the first hollowed-out region on the substrate, and a material of the first block layer comprises an oxidation-resistant material; and wherein the drive base plate further comprises:

a second conductive layer located on a side of the first conductive layer facing away from the substrate, the first block layer being located between the first conductive layer and the second conductive layer; and a first insulation layer located on a side of the first conductive layer facing away from the substrate; wherein the first insulation layer comprises: a first inorganic layer adjacent to the substrate; an organic layer located on a side of the first inorganic layer facing away from the substrate; and a second inorganic layer located on a side of the organic layer facing away from the substrate;

wherein the first block layer is located on a side of the second inorganic layer of the first insulation layer facing away from the substrate, and the second conductive layer is located on a side of the first block layer facing away from the substrate.

2. The drive base plate according to claim 1, wherein the first insulation layer is provided with a first opening; the orthogonal projection of the first hollowed-out region on the substrate is located within the orthogonal projection of the first opening on the substrate, and a surface of the first contact pad facing away from the substrate is exposed.

3. The drive base plate according to claim 2, wherein the first block layer covers at least a side surface of any of the first conductive portions, the side surface being multiple faces adjoining a bottom surface of any of the first conductive portions facing the substrate.

4. The drive base plate according to claim 1, wherein the second conductive layer comprises multiple conductive portion groups, each conductive portion group among the multiple conductive portion groups comprises at least two second conductive portions, and each of the second conductive portions comprises a second contact pad; and wherein the second contact pad passes through the first hollowed-out region to directly lap over the first contact pad, and a surface of the second contact pad facing away from the substrate is exposed.

5. The drive base plate according to claim 4, further comprising:

wherein the first insulation layer comprises multiple second openings, and the second contact pad passes through the first hollowed-out region and the second opening to directly lap over the first contact pad; wherein an orthographic projection of the second opening on the substrate is within the orthographic projection of the first hollowed-out region on the substrate.

6. The drive base plate according to claim 5, further comprising:

a second block layer located between the first conductive layer and the first insulation layer, a material of the second block layer comprises an oxidation-resistant material;

wherein the second block layer comprises a second hollowed-out region, and the second contact pad passes through the first hollowed-out region, the second opening, and the second hollowed-out region in sequence, and directly laps over the first contact pad; wherein the orthographic projection of the second opening on the substrate is located within an orthographic projection of the second hollowed-out region on the substrate.

7. The drive base plate according to claim 1, wherein the oxidation- resistant material comprises a molybdenum-niobium alloy.

8. The drive base plate according to claim 1, wherein the first conductive layer comprises: an inorganic layer close to the substrate, and a first metal layer on a side of the inorganic layer facing away from the substrate.

9. The drive base plate according to claim 4, wherein the second conductive layer comprises: a second metal layer close to the substrate; and a third metal layer located on a side of the second metal layer facing away from the substrate.

10. The drive base plate according to claim 4, wherein a thickness of any one of the first conductive portions is greater than the thickness of any one of the second conductive portions; a ratio of the thickness of any one of the first conductive portions to the thickness of any one of the second conductive portions is greater than or equal to 5, and less than or equal to 7.

11. The drive base plate according to claim 1, wherein the first conductive portion comprises a signal line.

12. The drive base plate according to claim 5, wherein the first conductive portion comprises a signal line, the signal line comprises the first contact pad corresponding to the first hollowed-out region, and the second conductive layer further comprises multiple connection lines;

wherein each of the connection lines is in direct contact with the signal line below through a third opening penetrating through the first insulation layer, so that the second contact pad is electrically connected to the connection line through the signal line;

wherein the orthographic projection of the signal line on the substrate overlaps with the orthographic projection of the connection line on the substrate, and the orthographic projection of the signal line on the substrate covers the orthographic projection of the second contact pad on the substrate.

13. The drive base plate according to claim 4, further comprising:

a second insulation layer located on a side of the second conductive layer facing away from the substrate, the second insulation layer comprises a fourth opening, wherein the orthographic projection of the second contact pad on the substrate is within the orthographic projection of the fourth opening on the substrate.

14. A light-emitting base plate, comprising multiple electronic elements and the drive base plate according to claim 1;

wherein each electronic element among the multiple electronic elements comprises at least two pins, each pin of the electronic element being soldered with the first contact pad on the drive base plate.

15. The light-emitting base plate according to claim 14, wherein the electronic elements comprise at least one of an inorganic light-emitting diode and a drive chip;

wherein the drive chip is used for driving the inorganic light-emitting diode to emit light.

16. A display device, comprising the light-emitting base plate according to claim 14.

17. The drive base plate according to claim 1, wherein the first conductive portion comprises a connection line.

18. The drive base plate according to claim 11, wherein the first conductive portion comprises a connection line.

* * * * *